(12) United States Patent
Gaynes et al.

(10) Patent No.: US 6,670,223 B2
(45) Date of Patent: *Dec. 30, 2003

(54) COUPLED-CAP FLIP CHIP BGA PACKAGE WITH IMPROVED CAP DESIGN FOR REDUCED INTERFACIAL STRESSES

(75) Inventors: Michael Anthony Gaynes, Vestal, NY (US); Eric Arthur Johnson, Greene, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/285,023

(22) Filed: Oct. 31, 2002

(65) Prior Publication Data

US 2003/0053297 A1 Mar. 20, 2003

Related U.S. Application Data

(62) Division of application No. 09/797,078, filed on Mar. 1, 2001.

(51) Int. Cl.[7] ............................................... H01L 21/48
(52) U.S. Cl. ..................... 438/118; 438/119; 438/122
(58) Field of Search ................................ 257/707, 712, 257/717; 438/118, 119, 122

(56) References Cited

U.S. PATENT DOCUMENTS

| | | | |
|---|---|---|---|
| 5,213,868 A | 5/1993 | Liberty et al. | |
| 5,309,321 A | 5/1994 | Olla et al. | |
| 5,365,402 A | 11/1994 | Hatada et al. | |
| 5,485,037 A | 1/1996 | Marrs | |
| 5,543,194 A | * 8/1996 | Rudy | 428/69 |
| 5,719,444 A | 2/1998 | Tilton et al. | |
| 5,726,079 A | 3/1998 | Johnson | |
| 5,745,344 A | 4/1998 | Baska et al. | |
| 5,777,847 A | 7/1998 | Tokuno et al. | |
| 5,883,430 A | 3/1999 | Johnson | |
| 5,960,863 A | 10/1999 | Hua | |
| 5,986,885 A | 11/1999 | Wyland | |
| 6,037,658 A | * 3/2000 | Brodsky et al. | 257/707 |
| 6,104,093 A | 8/2000 | Caletka et al. | |
| 6,150,195 A | * 11/2000 | Chiu et al. | 438/118 |
| 6,501,171 B2 | * 12/2002 | Farquhar et al. | 257/706 |

FOREIGN PATENT DOCUMENTS

WO    WO 95/02505    1/1995

\* cited by examiner

*Primary Examiner*—David Nelms
*Assistant Examiner*—Dao H. Nguyen
(74) *Attorney, Agent, or Firm*—Scully, Scott, Murphy & Presser; William H. Steinberg

(57) ABSTRACT

Wire bond packages which mount encapsulated semiconductor chips, such as plastic ball grid array (PBGA) packages providing for the mounting of so-called flip-chips. The chips are overlaid with a heat spreading thermally-conductive cap of a mesh-like material which is interstitially the filled with an adhesive to prevent delamination caused by mismatches in the coefficients of thermal expansion, which result in contractions which cause the entire package arrangement to warp, leading to delamination between an encapsulant and cap and resulting in failure of connect joints and the ball grid arrays.

18 Claims, 1 Drawing Sheet

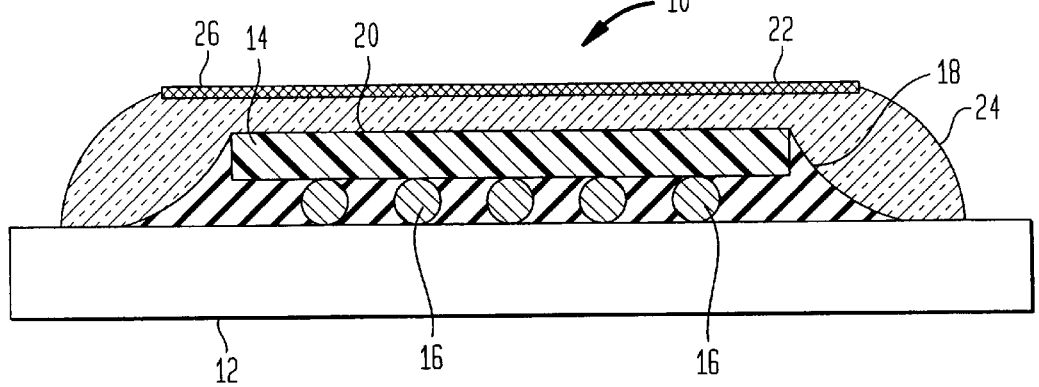
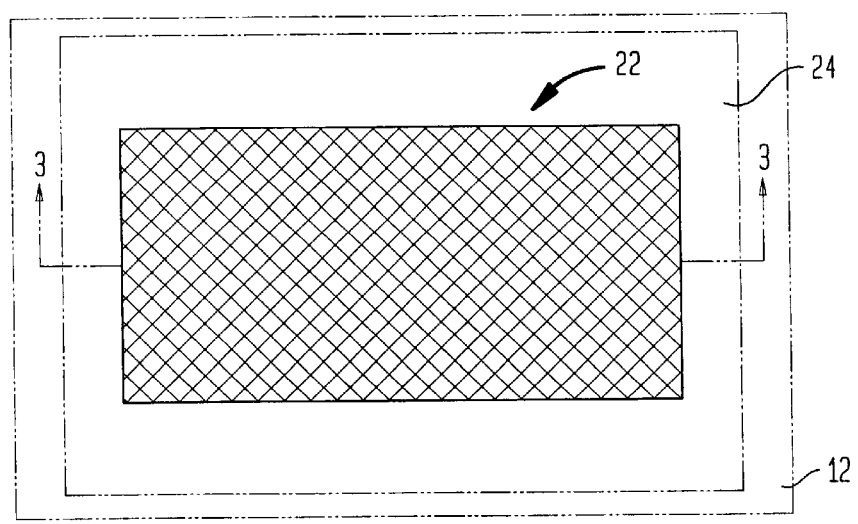
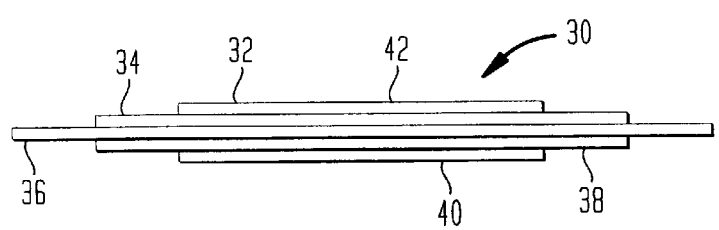

COUPLED-CAP FLIP CHIP BGA PACKAGE WITH IMPROVED CAP DESIGN FOR REDUCED INTERFACIAL STRESSES

This is a divisional application of U.S. patent application Ser. No. 09/797,078; filed on Mar. 1, 2001.

BACKGROUND OF THE INVENTION

1. Field of the Invention

The present invention relates, in general, to electronic packages, and particularly organic laminate chip carrier packages which mount encapsulated semiconductor chips, such as plastic ball grid array (PBGA) packages. These may provide for the mounting of so-called flip-chips, and wherein the chips are usually overlaid with a heat spreading cap designed to balance the coefficients of thermal expansion (CTE) and the stiffness of a substrate which is exposed on sides opposite of the chips. This is intended to compensate for mismatches in the coefficients of thermal expansion, resulting in contractions which cause the entire package arrangement to warp, leading to delamination between an encapsulant and cap and resulting in failure of connect joints and the ball grid arrays.

The concept of compensating for any mismatches in coefficients of thermal expansion (CTE) and resultant contractions which are encountered between the various components of a wire bond or flip chip package or module including encapsulated semiconductor chips mounted on substrates has been addressed in the technology. In this connection, heat sinks supported on the chips in the form of caps in order to reduce heat-induced bending or warpage tending to separate the components and leading to failures of the electrical connects and ball grid arrays adversely affecting the functioning and reliability of the packages has also been widely addressed in the technology and industry. The foregoing difficulties are encountered due to package warping as a result of thermal stresses generated, in that the normally utilized adhesives which cement the chip and cap to the substrate may possess coefficients of thermal expansion (CTE) which do not match and are substantially different from the coefficients of thermal expansion of the substrate. One of the possible failure mechanisms is delamination of the epoxy or adhesive interface between the chip and the cap as a result of thermally induced thermal stresses. Also, the tendency of the epoxy adhesive to absorb or desorb moisture may readily cause delamination by either increasing interfacial stresses at the cap and chip, or by degrading the strength of these interfaces.

2. Discussion of the Prior Art

At this time, various types of structures have been employed in the technology which concern themselves with the provision of means for dissipating heat which is generated during the operation of the module, and to minimize any potential module warpage or bending which can lead to operative failure and/or reduction in the service life thereof.

In particular, the semiconductor chips have been equipped with superimposed heat sinks in the form of so-called caps or covering structures which are adhesively fastened thereto; for example, such as through the interposition of an epoxy adhesive or the like, and wherein the caps extend generally above the areas defined by the surface extent of the chips. Such caps are normally constituted of a solid heat-conductive material, such as steel or copper. Other types of caps may incorporate multiple laminated layers of different materials or have fins formed thereon, providing enlarged surface areas for dispersing and dissipating heat, whereas other structures may have the caps extending beyond the confines of the chip and be suitably shaped to theoretically optimize the rate of heat dissipation from the module arrangements.

Among various publications which address themselves to the problems encountered caused by the formation of such interfacial stresses causing delamination of the module components, are Caletka et al. U.S. Pat. No. 6,104,093. This patent discloses a thermally enhanced and mechanically balanced flip chip package in which there is a balancing effected in the stiffness between and the coefficients of thermal expansion (CTE) of both a thermally conductive member and a laminate substrate.

Similarly, Johnson U.S. Pat. Nos. 5,883,430 and 5,726,079 also direct themselves to solving the problems of potential delamination between the module components of thermally-enhanced electronic flip-chip packages.

Tokuno et al U.S. Pat. No. 5,777,847 discloses a multichip module including a metallic cover plate fastened by means of a support pillar to a substrate, and wherein the plate is constituted of a heat conductive material, preferably such as copper or other suitable metal, such as aluminum or an aluminum alloy.

Marrs U.S. Pat. No. 5,485,037 discloses a heat sink in the form of a cap or cover structure arranged above a semiconductor chip which is mounted on a substrate, and which includes a plurality of holes adapted to be filled with a suitable filler material facilitating the dissipation of heat in a generally uniformly dispersed manner across the surface of the chip while maintaining the essential rigidity or stiffness of the heat sink or cap.

Baska et al U.S. Pat. No. 5,745,344 discloses a heat-dissipating apparatus including spaced fins for absorbing heat generated by an electronic device.

Liberty et al U.S. Pat. No. 5,213,868 is directed to a thermally conductive interface material of a polymeric binder and one or more thermal filters so as to form a heat sink for an electronic component.

Other types of structures which are adapted to be employed as heat sinks and which are arranged above encapsulated semiconductor chips and fastened thereto through the intermediary of epoxy adhesives, which may include heat conductive greases, including cap configurations incorporating pluralities of holes in varying specified sizes and arrays, and also scallops formed along the edges of the caps extending over the edge portions of the chips located therebeneath so as to allow for improved degrees of heat dissipation therefrom. Thus, for example, a thermally-enhanced heat-dissipating cap structure providing excellent mechanical interconnection of the components is disclosed in copending Caletka and Johnson patent application Ser. No. 09/430,075; filed Oct. 29, 1999, (Attorney Docket No.: END919980109US1) which is commonly assigned to the present assignee and the disclosure of which is incorporated herein by reference.

The foregoing types of cap or cover constructions are intended to form heat sinks are adept at dissipating heat from the semiconductor chips and ball grid arrays, but do not maintain package flatness. Other types of package constructions, in which the caps or cover structures forming the heat sink mounted above the chips reduce warpage and potential failure of the ball grid arrays and the entire package modules, have been found to delaminate. Further improvements in design and construction would still further enhance the adhesion of the caps while maintaining package flatness, thereby increasing the service life of the package module or electronic module arrangement.

SUMMARY OF THE INVENTION

In particular, pursuant to the invention, there is contemplated the provision of a novel heat-dissipating and structural balancing cap mounted above an encapsulated chip of an electronic package, wherein the cap preferably extends beyond the edges or confines of the chip, and may be essentially constituted of a unique mesh structure, rather than being formed from a solid material.

With the currently employed coupled cap design stresses between the cap and structural adhesive result in delamination after the ingress of moisture, or just due to solder reflow, or because of thermal cycling. Modeling has evidenced that it is the combination of the CTE and in-plane stiffness of the cap that balances the laminate while it is the bending stiffness of the cap and the expansion of the epoxy (with both due to effects of temperature and moisture) which control the interfacial stresses that produce delamination. For the present invention, for the cap the in-plane stiffness has been maximized and the bending stiffness minimized by preferably selecting a high-modulus material, such as steel, for the cap. Other materials, such as ceramics, also have a high modulus but may have a CTE that is too low to effectively balance the laminate, whereby metal, such as steel, remains an excellent selection in choosing a material in producing the cap.

By using a woven steel mesh instead of a solid metal cap, mechanically interlocking of the mesh and matrix substantially improves upon the adhesion thereof. Other high modulus, fibrous materials can also be used to advantage (such as carbon or boron fiber) but are expensive, and evidence somewhat poorer thermal conductivity or a modulus which is lower than that of steel. Other metals could also be used in place of steel.

Experiments with other types of materials, such as glass-cloths have also shown that certain weaves are more flexible than others. Leno and Satin weaves are particularly flexible during processing and would give the lowest bending stiffness with no loss to the in-plane properties, and it is possible to contemplate a balanced structure with one or more woven sheets of a high-modulus material (greater than 10 MPSI) or oriented fibers embedded in an epoxy matrix.

Preferably, pursuant to one inventive concept, the cover or cap is constituted of a thermally-conductive mesh like or woven metallic material which will improve resistance to delamination between the encapsulant, such as an epoxy and the cap, causing only a slight reduction in the bending stiffness of the cap while concurrently maintaining the in-plane stiffness of the cap to an essentially high degree. The bonding adhesive flows through the metal mesh effectively producing a composite with the correct stiffness and expansion rate and also locking the metal in place, thereby eliminating the large continuous interface between adhesive and solid cap.

Accordingly, it is a primary object of the present invention to provide a heat-dissipating structure that, by balancing the stiffness and expansion of the substrate, this reduces the warpage or bending encountered between the components of a semiconductor package module as a consequence of the presence of different coefficients of thermal expansion (CTE) among the various module components of the module.

A more specific object resides in the provision of a novel heat-dissipating cap structure for an encapsulated semiconductor chip package structure wherein the cap is formed of a woven thermally-conductive metallic mesh material, having a bonding adhesive flown therethrough to produce a composite with specified correct degrees of stiffness and expansion rates between the structural components, and with mesh interlocking to ensure reliable adhesion.

Yet another object of the present invention resides in the provision of a heat-dissipating cap structure as described herein, wherein the cap structure is essentially constituted of fibrous non-metallic materials, such as carbon, boron fibers or glass-cloths of various weaves.

Still another object of the invention is to provide a structure which can be manufactured using either a transfer mold or a paste adhesive dispensing process.

BRIEF DESCRIPTION OF THE DRAWINGS

Reference may now be made to the following detailed description of preferred embodiments of the invention, taken in conjunction with the accompanying drawings; in which:

FIG. 1 illustrates, generally diagrammatically, a side elevational view of an electronic package arrangement, such as a semiconductor chip package or module including a mesh-like cap structure forming a heat sink for the dissipating of heat generated during the operation of the package;

FIG. 2 illustrates a top plan view of a mesh-like cap structure which is constituted of a thermally conductive member pursuant to the invention;

FIG. 3 illustrates, on an enlarged scale, a sectional view through the cap structure taken along line 3—3 in FIG. 2; and FIG. 4 illustrates a sectional view, similar to FIG. 3, of a laminated cap structure of non-uniform thickness.

DETAILED DESCRIPTION OF PREFERRED EMBODIMENT

Reverting in detail to the drawings, and particularly to FIG. 1, there is disclosed an electronic package comprising a semiconductor chip package or module 10 which essentially includes a circuitized substrate 12, which may be constituted of an organic material or laminate. Positioned above the circuitized substrate 12 is a semiconductor chip 14, which is electrically coupled to the substrate 12, for example through the intermediary of solder ball controlled collapse chip connections (C4) 16, and with the provision of an underfill 18 between components 12 and 14, as shown in the drawing.

In turn, positioned above the semiconductor chip 14 so as to face the surface 20 of the latter in closely spaced relationship is a cover or cap structure 22, which in this instance is shown as being is constituted of a flat or planar member, preferably of rectangular or square configuration in plan view relative to the peripheral configuration of the semiconductor chip 14.

As illustrated in FIG. 2, in order to provide an enhanced degree of mechanical interlocking or bonding between the components of the electronic package 10, the components are encapsulated by a rigid dielectric material 24, such as an adhesive, as is well known in the technology.

In order to improve upon the physical interlocking or mechanical interconnection between the package and the cap structure 22, which effectively may act as a heat sink or thermally heat-dissipating member, the latter is constituted of a mesh-like or woven lattice-type structure which is preferably adapted to be at least partially filled with an adhesive composition, as described hereinbelow.

Although, preferably, the cap structure 22 is constituted of any suitable metal, and especially steel, other materials readily lend themselves to the invention in the use of a woven mesh instead of a solid cap.

In connection with the invention, it is also possible to employ various non-metallic fibrous materials, such as carbon or boron fibers, which however, have somewhat poorer thermal conductivities and moduli than those of metal, such as steel. Furthermore, glass-cloths also indicate that certain weaves may be more flexible than others, whereby so-called Leno and Satin weaves are particularly flexible and would impart the lowest bending stiffness with no loss of in-plane properties in their rigidity or stiffness. Moreover, oriented fibers embedded in an epoxy matrix could also be feasibly employed, wherein a bonding adhesive, such as 24, is adapted to flow through the mesh causing the produced composite to assume a correct degree of stiffness and expansion rate while locking the mesh in place, thereby eliminating any large continuous interface which is encountered between the adhesive and a solid cap.

The at least preferably thermally conductive cap structure 22 is firmly anchored in a firmly secured position over the semiconductor chip 14 in that the encompassing dielectric material, such as adhesive 24, is enabled during manufacture to flow into the interstitial confines of the mesh-like cap structure, until filling or at least partially filling the latter up to the plane of the upper surface 26 of the cap structure 22. This particular aspect of at least partially filling the mesh-like cap structure 22 with the dielectric material adhesive 24, enhances the interfacial adhesion of the encapsulating adhesive which bonds the cap structure 22 to the chip 14 by the at least partial filling of the mesh interstices therewith.

Preferably, as mentioned hereinbefore, although not necessarily the cap structure 22 is constituted of steel, although other metallic and/or non-metallic materials would also be applicable in lieu thereof in order to provide the thermally-conductive mesh-like cap pursuant to the present invention.

Pursuant to a further aspect, the function of the cap structure 22 may prevent warpage by balancing the thermal expansion of the package or module layers during heating or cooling, and may provide a function as a heat spreader due to its possessing some degree of thermal conductivity, so as to be essentially considered as constituting a thermally conductive member.

Pursuant to the embodiment of FIG. 4 of the drawings, rather than utilizing a cap structure of uniform thickness, the cap may be constituted from a laminated mesh having different areal sizes for the various layers thereof so as to provide a non-uniform thickness which thins out toward the extreme edges beyond the peripheral confines of semiconductor chip over which the cap is positioned.

Accordingly, as shown in FIG. 4 of the drawings, in this instance the cap structure 30 includes a plurality of laminated layers 32, 34, 36, 38, and 40, as may be desired, each of which is differently sized in area so as to have the greatest rigidity towards the center portion 42 of the cap structure 30 which extends over the chip 14. This non-uniformly thick cap structure 30 will also be adequate in use by overlaying meshes of different areal dimensions in providing the required stiffness, while the reduced thicknesses in the areas about the cap edges reduces the expansion of the matrix-forming bonding or epoxy adhesives.

From the foregoing, it becomes readily apparent that the construction of the cap structure 22 or 30 as a mesh-like or woven mesh metallic or non-metallic material and which significantly increases the interstitial bonding surface areas available for the dielectric material, such as adhesive 24, enhances the strength of the entire module or electronic package 10 while concurrently inhibiting warpage thereof so as to inhibit delamination between the cap structure 22 or 30 and the semiconductor chip 14 caused by thermally-induced thermal stresses.

While the invention has been particularly shown and described with respect to illustrative and preferred embodiments thereof, it will be understood by those skilled in the art that the foregoing and other changes in form and details may be made therein without departing from the spirit and scope of the invention which should be limited only by the scope of the appended claims.

What is claimed is:

1. A method of producing an electronic package, comprising:

providing a circuitized substrate having an upper surface;

mounting a semiconductor chip on said upper surface of said circuitized substrate so as to be electrically and mechanically coupled to said substrate, said semiconductor chip having a substantially planar upper surface and at least one edge surface being substantially perpendicular to said substantially planar upper surface;

providing a thermally conductive member constituted of a laminate of a plurality of woven mesh layers, and having upper and lower surfaces, said lower surface of said thermally conductive member being thermally coupled to said substantially planar upper surface of said semiconductor chip, said thermally conductive member further having at least one edge surface extending around a defined perimeter of said thermally conductive member, said laminate layers are of differing areal dimensions so as to form a thermally conductive member of non-uniform thickness which reduces towards the peripheral edges thereof; and imparting a dielectric material to at least an areal portion of said circuitized substrate, against at least a portion of said at least one edge surface of said thermally conductive member, against a portion of said upper surface of said woven mesh thermally conductive member and against at least a portion of said at least one edge surface of said semiconductor chip.

2. A method as claimed in claim 1, wherein said dielectric material comprises a paste-like structural composition.

3. A method as claimed in claim 1, wherein said dielectric material comprises an essentially rigid material composition.

4. A method as claimed in claim 1, wherein said thermally conductive member comprises a metallic woven mesh.

5. A method as claimed in claim 4, wherein said metallic woven mesh consists of steel.

6. A method as claimed in claim 1, wherein said dielectric material is at least partially filled into interstitial spaces present in said mesh-like material so as to form a rigid composite therewith and enhance the mechanical interlocking between said thermally conductive member and said semiconductor chip.

7. A method as claimed in claim 6, wherein said dielectric material completely fills the interspaces of said mesh-like material.

8. A method as claimed in claim 6, wherein said dielectric material is applied as a rigid composition.

9. A method as claimed in claim 6, wherein said dielectric material comprises a bonding adhesive.

10. A method as claimed in claim 9, wherein said bonding adhesive comprises an epoxy adhesive.

11. A method as claimed in claim 1, wherein said thermally conductive member extends beyond the peripheral configures of said semiconductor chip.

12. A method as claimed in claim 1, wherein said thermally conductive member is a plate structure of substantially uniform thickness.

13. A methods as claimed in claim 1, wherein said thermally conductive member is constituted of a non-metallic woven mesh material.

14. A method as claimed in claim 13, wherein said non-metallic woven mesh material comprises high modulus fibrous constituents.

15. A method as claimed in claim 14, wherein said fibrous constituents comprise carbon or boron fibers.

16. A method as claimed in claim 14, wherein said fibrous constituents comprise oriented fibers embedded in an epoxy matrix.

17. A method as claimed in claim 13, wherein said non-metallic woven mesh material comprises a glass-cloth.

18. A method as claimed in claim 17, wherein said glass-cloth is imparted a Leno or Satin weave.

* * * * *